(12) United States Patent
Hartwich

(10) Patent No.: US 8,447,952 B2
(45) Date of Patent: May 21, 2013

(54) METHOD FOR CONTROLLING ACCESS TO REGIONS OF A MEMORY FROM A PLURALITY OF PROCESSES AND A COMMUNICATION MODULE HAVING A MESSAGE MEMORY FOR IMPLEMENTING THE METHOD

(75) Inventor: Florian Hartwich, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/736,825

(22) PCT Filed: Mar. 6, 2009

(86) PCT No.: PCT/EP2009/052652
§ 371 (c)(1),
(2), (4) Date: Feb. 28, 2011

(87) PCT Pub. No.: WO2009/138260
PCT Pub. Date: Nov. 19, 2009

(65) Prior Publication Data
US 2011/0145491 A1  Jun. 16, 2011

(30) Foreign Application Priority Data
May 14, 2008  (EP) .......................... 10 2008 001 739

(51) Int. Cl.
*G06F 12/00* (2006.01)
(52) U.S. Cl.
USPC ..................................... 711/211; 711/E12.78

(58) Field of Classification Search
None
See application file for complete search history.

(56) References Cited

U.S. PATENT DOCUMENTS

| 5,927,218 | A | * | 7/1999 | Tretter et al. | 112/38 |
|---|---|---|---|---|---|
| 6,138,204 | A | * | 10/2000 | Amon et al. | 711/104 |
| 7,882,295 | B2 | * | 2/2011 | Karuturi | 710/307 |
| 2001/0049742 | A1 | * | 12/2001 | Steely et al. | 709/232 |
| 2003/0182498 | A1 | * | 9/2003 | Villaret et al. | 711/108 |
| 2009/0175290 | A1 | * | 7/2009 | Newald et al. | 370/428 |

FOREIGN PATENT DOCUMENTS

| CN | 1808412 | 7/2006 |
|---|---|---|
| DE | 195 29 718 | 2/1997 |
| DE | 10 2005/048584 | 1/2007 |
| JP | 11-510930 | 9/1999 |

\* cited by examiner

*Primary Examiner* — Edward Dudek, Jr.
*Assistant Examiner* — Sean D Rossiter
(74) *Attorney, Agent, or Firm* — Kenyon & Kenyon LLP

(57) ABSTRACT

A method for controlling access to regions of a memory from a plurality of processes. In order to allow a plurality of processes to access the most recent data packets stored in the memory without any loss of data and without a waiting period, according to the present invention a first one of the processes controls part of an address bus using which another one of the processes accesses the memory, the first process influencing which memory region is accessed by the other process by controlling the part of the address bus.

28 Claims, 4 Drawing Sheets

| 10 | 11 | 12 | 13 |
|---|---|---|---|
| 0 | A | 0_A_Word_0 | _00_0_00 |
| | | 0_A_Word_1 | _00_0_01 |
| | | 0_A_Word_2 | _00_0_10 |
| | | 0_A_Word_3 | _00_0_11 |
| | B | 0_B_Word_0 | _00_1_00 |
| | | 0_B_Word_1 | _00_1_01 |
| | | 0_B_Word_2 | _00_1_10 |
| | | 0_B_Word_3 | _00_1_11 |
| 1 | A | 1_A_Word_0 | _01_0_00 |
| | | 1_A_Word_1 | _01_0_01 |
| | | 1_A_Word_2 | _01_0_10 |
| | | 1_A_Word_3 | _01_0_11 |
| | B | 1_B_Word_0 | _01_1_00 |
| | | 1_B_Word_1 | _01_1_01 |
| | | 1_B_Word_2 | _01_1_10 |
| | | 1_B_Word_3 | _01_1_11 |
| 2 | A | 2_A_Word_0 | _10_0_00 |
| | | 2_A_Word_1 | _10_0_01 |
| | | 2_A_Word_2 | _10_0_10 |
| | | 2_A_Word_3 | _10_0_11 |
| | B | 2_B_Word_0 | _10_1_00 |
| | | 2_B_Word_1 | _10_1_01 |
| | | 2_B_Word_2 | _10_1_10 |
| | | 2_B_Word_3 | _10_1_11 |
| 3 | A | 3_A_Word_0 | _11_0_00 |
| | | 3_A_Word_1 | _11_0_01 |
| | | 3_A_Word_2 | _11_0_10 |
| | | 3_A_Word_3 | _11_0_11 |
| | B | 3_B_Word_0 | _11_1_00 |
| | | 3_B_Word_1 | _11_1_01 |
| | | 3_B_Word_2 | _11_1_10 |
| | | 3_B_Word_3 | _11_1_11 |

Fig. 2

METHOD FOR CONTROLLING ACCESS TO REGIONS OF A MEMORY FROM A PLURALITY OF PROCESSES AND A COMMUNICATION MODULE HAVING A MESSAGE MEMORY FOR IMPLEMENTING THE METHOD

FIELD OF THE INVENTION

The present invention relates to a method for controlling access to regions of a memory from multiple processes. The present invention also relates to a communication module of a node of a communication system, the module being connected to a communication medium and having a message memory for temporary storage of messages received via the medium or to be sent via the medium.

BACKGROUND INFORMATION

Many different applications in which various processes use the same memory to exchange data with one another are known from the related art. One example of such processes is a central processing unit (CPU) and any peripheral device, both of which access the same random access memory (RAM) to exchange data between the CPU and the peripheral device.

If the data to be exchanged when accessing the same message memory from a plurality of processes are in the form not only of individual memory words but also of data packets, each having a plurality of words, the question of data consistency and data integrity becomes more important. Data consistency is violated when, for example, one process is reading a certain data packet while another process is altering the same data packet. The reading process in such a case may receive a data packet composed of a mixture of old and new memory words. This may result in serious problems in further processing of the contents of the data packets.

To prevent this, methods are known from the related art by which one of the two processes observes the other process prior to accessing a data packet and, if necessary, waits until the other process has concluded its access. As an alternative, one process may also block access by the other process, but this may result in data loss if the blocked process is unable to save its data before its buffer memory has to be used for other tasks. In addition, there are also other methods, by which at least one of the two processes accesses the memory only indirectly, a separate memory management control system storing the data packets in a consistent form in the memory and then retrieving the data packets from the same memory. However, this is relatively complicated and expensive. These known methods may be combined with multiple storage of data packets.

In addition, a communication module in the form of a so-called FlexRay communication controller (CC) is from the related art. The communication module is used to connect the FlexRay communication medium over which messages are transmitted, i.e., the data bus, to a FlexRay node. A corresponding communication controller for use in FlexRay in particular is discussed in DE 10 2005 034 744 A1, for example. For transmitting messages between the node and the communication medium, a specially designed configuration is provided in the communication controller for storing messages. The transmission of messages and management of the memory are controlled by a state machine.

Two so-called transient buffers (TBF), one for channel A and the other for channel B, are provided in the communication controller known from the related art. Each transient buffer may store two messages, namely an Rx (receive) message and a Tx (transmit) message. The interface module also includes a so-called input buffer (IBF) and an output buffer (OBF), each having a capacity of two messages.

The transient buffer (TBF) is accessed first from the communication medium and second via a so-called message handler of the FlexRay communication controller. The input and output buffers (IBF; OBF) are accessed first by the host CPU of the node and second by the message handler. When accessing the above-mentioned buffer of the communication controller from the aforementioned processes, it is a very important prerequisite to maintain data consistency and integrity. For this reason, with the known communication controller, the host CPU does not have any direct access to the message memory (IBF; OBF). The input and output buffers instead have two separate memory blocks (so-called IBF and IBF shadow and OBF and OBF shadow). To send data, the host CPU writes data into the input buffer and then initiates a message transfer. Next the content of the IBF and the IBF shadow are exchanged. Then the transmission of data from the IBF shadow into the message memory (so-called message RAM) begins. The host CPU may write the data from the following message directly into the input buffer (IBF), while the data transmission from the IBF shadow to the message RAM is still underway. The data from the message RAM is then transmitted via the communication medium to other nodes. After the end of the data transmission between the IBF shadow and the message RAM, the contents of IBF and the IBF shadow are exchanged again, and so forth.

Due to this relative complex measure, data integrity may be ensured, but this measure demands a large amount of chip area because each message memory (IBF, OBF) must be present in duplicate. Additional disadvantages of the known communication controller include the fact that the message handler is a relatively large so-called state machine which is therefore expensive. Furthermore, the method described here results in both present data and older data being stored in the message memory (message RAM). In addition, access by the host CPU to the message RAM via the input and output buffers (IBF, OBF) is relatively complex because direct access is impossible and instead only indirect access via IBF shadow and OBF shadow are possible.

SUMMARY OF THE INVENTION

An object of the exemplary embodiments and/or exemplary methods of the present invention is to simplify, in particular to accelerate, access by multiple processes to the same memory, and thereby enable an inexpensive implementation while at the same time data integrity must be ensured.

To achieve this object, it is proposed that, starting from the method for controlling access to memory regions of the aforementioned type, a first process controls a part of an address bus using which another of the processes accesses the memory, so that by controlling part of the address bus, the first process influences which memory region the other process will access.

According to the exemplary embodiments and/or exemplary methods of the present invention, a method is proposed for how a process may control access by another process to a data packet stored in the memory in such a way that both processes are able to access the most recent valid data packets without any waiting time and without any data loss. The method according to the present invention is suitable for memories which may be accessed by a plurality of processes, in particular two processes at the same time (dual-ported RAM), and for memories accessed by a plurality of processes in alternation, in particular in a time multiplex method (so-called single-ported RAM). This method may then be used not only for memories in which two processes access the same memory but also for methods in which more than two processes access the same memory.

In the method according to the present invention, one of the processes controls a part of the address bus using which another process accesses the memory. The address bus may be controlled by the first process via writable control registers, for example. In this way, a simple option which is inexpensive to implement is proposed for how both or all processes may access the same memory without waiting times, without loss of data packets, and without requiring complex memory management control systems.

In this method, all data packets may be of the same size. In particular all data packets include $2^n$ memory words. If this is not the case, the data packets may be split into two parts, a so-called header part having a fixed size, in particular $2^n$ memory words, and a main part of a variable size. The header part contains a pointer to the main part which may be stored in the same memory or in another memory. The data packets and header parts of the data packets may be stored in at least two versions in the memory.

In the method according to the present invention, a first process may access all memory regions of the memory. Furthermore, the first process may modify the address bus signal by which another process accesses the same memory. This is true only of access to data packets of the same size or, if the data packets are split into a header part and a main part, this applies to access to header parts of the same size. Access to the header part of the data packets is not modified but instead takes place via the pointer to the main part stored in the corresponding header part.

The other process accessing one of up to $2^m$ data packets or $2^m$ header parts of data packets, each containing $2^n$ memory words, produces an address signal of a certain bit length. At a data packet size or header part size of the data packets of $2^n$ memory words and access by the other process to up to $2^m$ data packets or $2^m$ header parts of data packets, the address signal of the second process has a length of (m+n) bits. However, the other process cannot differentiate between the addresses of one data packet stored multiple times, i.e., between the different versions of the data packet, by using the address signal it generates. This requires additional address bits made available by the first process. The additional address bits advantageously come from a control register, which is controlled by the first process. With k additional bits, a distinction is made between $2^k$ saved versions of a certain data packet or header part of a certain data packet. This yields an address signal of a total of (m+n+k) bits. The three bit groups in the address signal may have any positions.

The further descriptions herein describe advantageous embodiments of the method according to the present invention. Special features and advantages of the exemplary embodiments and/or exemplary methods of the present invention are explained in greater detail below with reference to the figures.

BRIEF DESCRIPTION OF THE DRAWINGS

FIG. 2 shows an example of the contents of a memory, the access to regions of the memory being controlled by the method according to the present invention.

DETAILED DESCRIPTION

Figure 1:
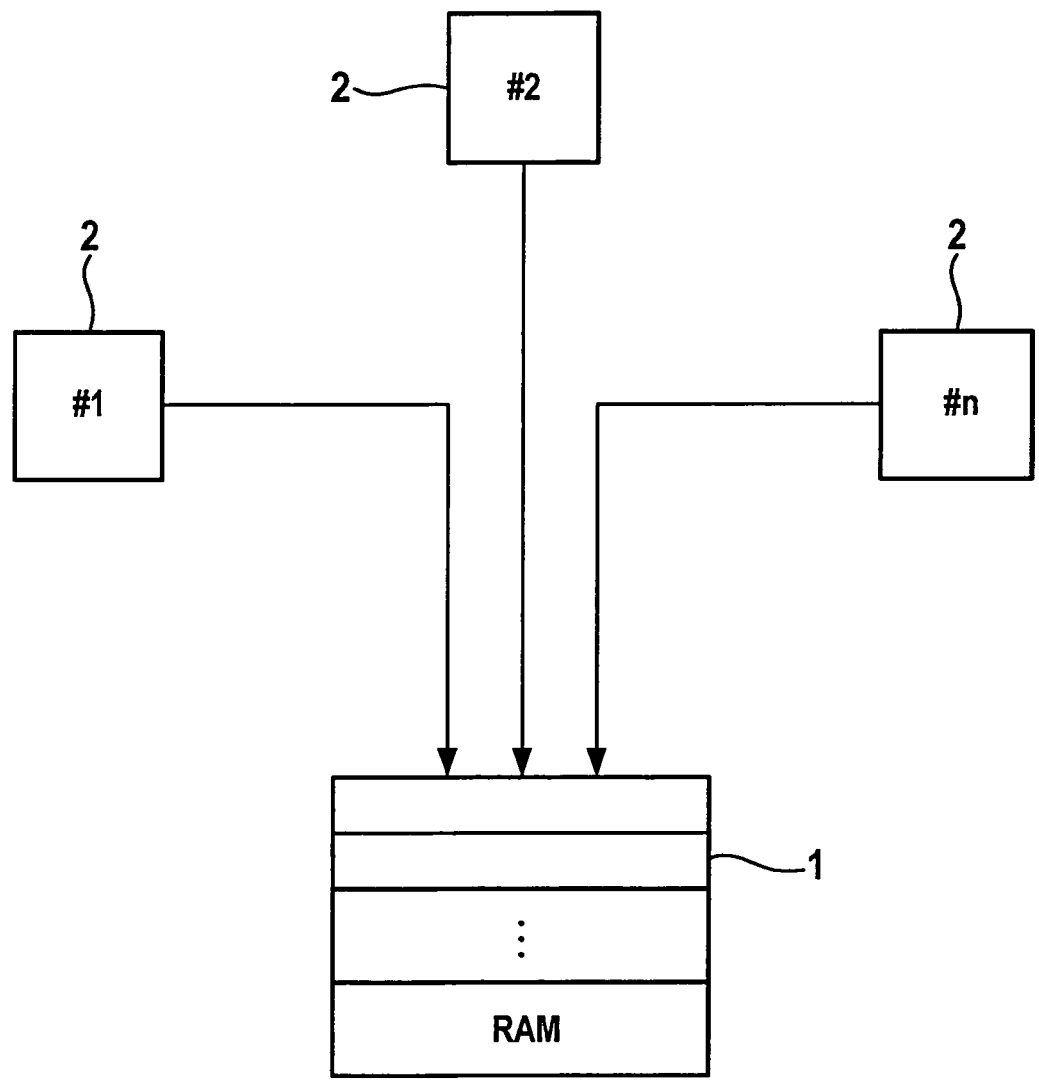
FIG. 1 shows a memory having different regions, which may be accessed from a plurality of processes.

FIG. 1 shows a memory 1 designed as a random access memory (RAM), for example. The memory may be designed in particular as a dual-ported RAM or as a single-ported RAM. Memory 1 may of course also be designed as any other volatile or nonvolatile writable memory. Multiple processes (#1, #2, #n) 2 may access regions of memory 1. Access to the memory regions includes in particular a write and/or a read access to memory 1. Processes 2 include, for example, a central processing unit (CPU) and any peripheral devices, which are able to access regions of same memory 1.

Figure 4:
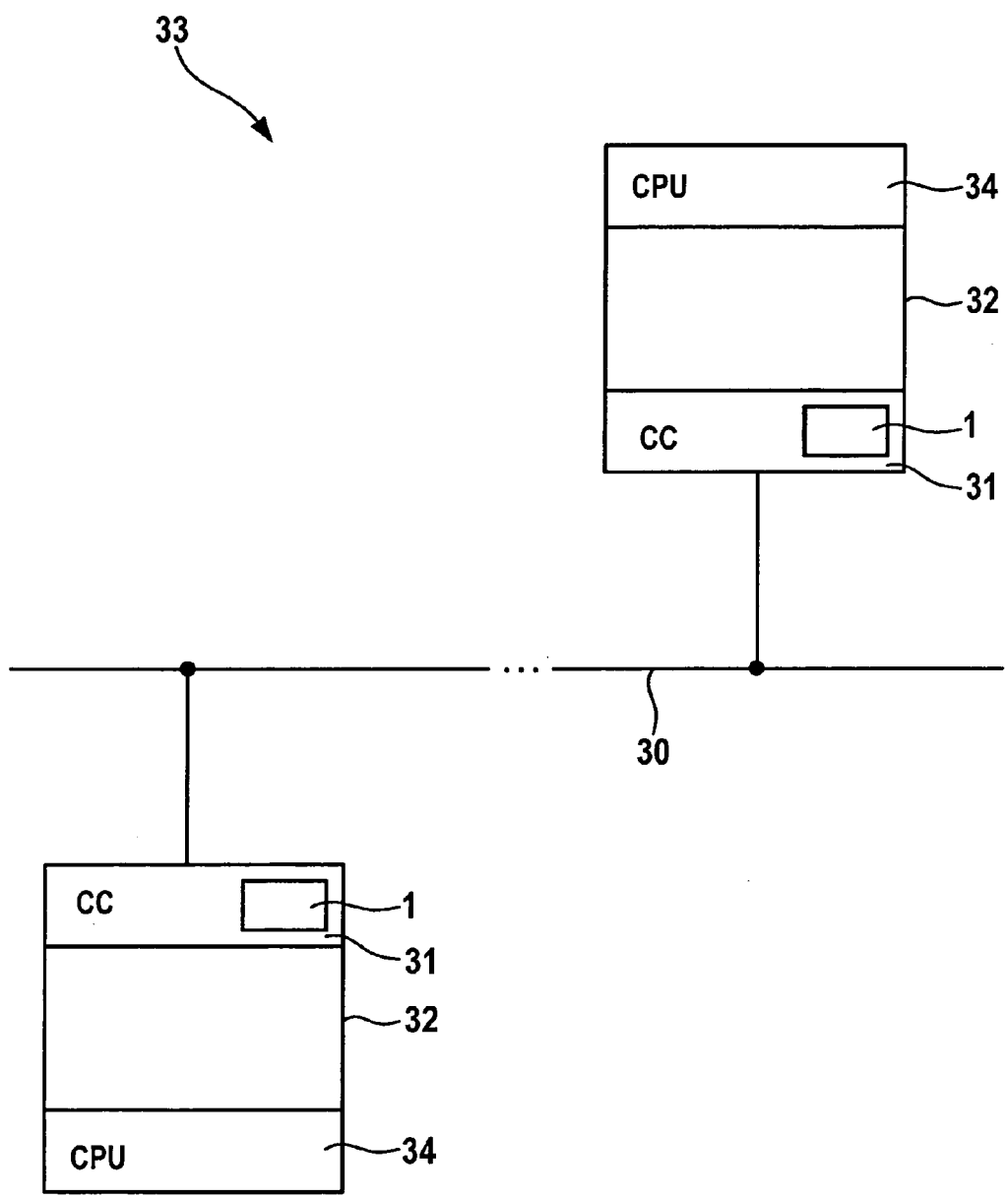
FIG. 4 shows a communication system having a plurality of communication nodes connected to a communication medium, each having a communication controller with a message memory, which may be accessed from various processes by the method according to the present invention.

Memory 1 may also be part of a communication controller (CC) 31 of a communication node 32 of a communication system 33, e.g., a FlexRay network, a CAN network or a TTCAN network, as shown in FIG. 4 as an example. Memory 1 may be accessed via a communication medium 30 (e.g., FlexRay bus, CAN bus, TTCAN bus) on the one hand and on the other hand by a host processor 34 (host CPU) of communication node 32, to which communication controller 31 is allocated.

Processes 2 utilize access to shared memory 1 for exchange of data in particular. If the data to be exchanged are present not only as individual memory words but also as data packets including a plurality of words, then the question of data integrity, in particular data consistency, becomes of primary concern. A memory word is the system-specific memory unit of a certain processing unit. A word is the largest volume of data which may be executed by a processor of the processing unit in one processing step, and usually corresponds to the width of the main data bus. Typical word lengths are 16 and 32 bits. The consistency of the data stored in memory 1 would be violated if, for example, a process #1 were to read a certain data packet while another process #2 is altering the same data packet. Reading process #1 might then receive a packet including a mixture of old and new data words. To prevent this, a method for how a process 2 is able to control access by another process 2 to a data packet stored in memory 1 is proposed according to the present invention, so that both processes are able to access the most recent valid data packets without any loss of data and without waiting times. This method is suitable for memory 1, which may be accessed by two or more processes 2 at the same time (dual-ported RAM) as well as for memory 1, which is accessed in alternation, which may be by the time-multiplex method (single-ported RAM).

Figure 3:
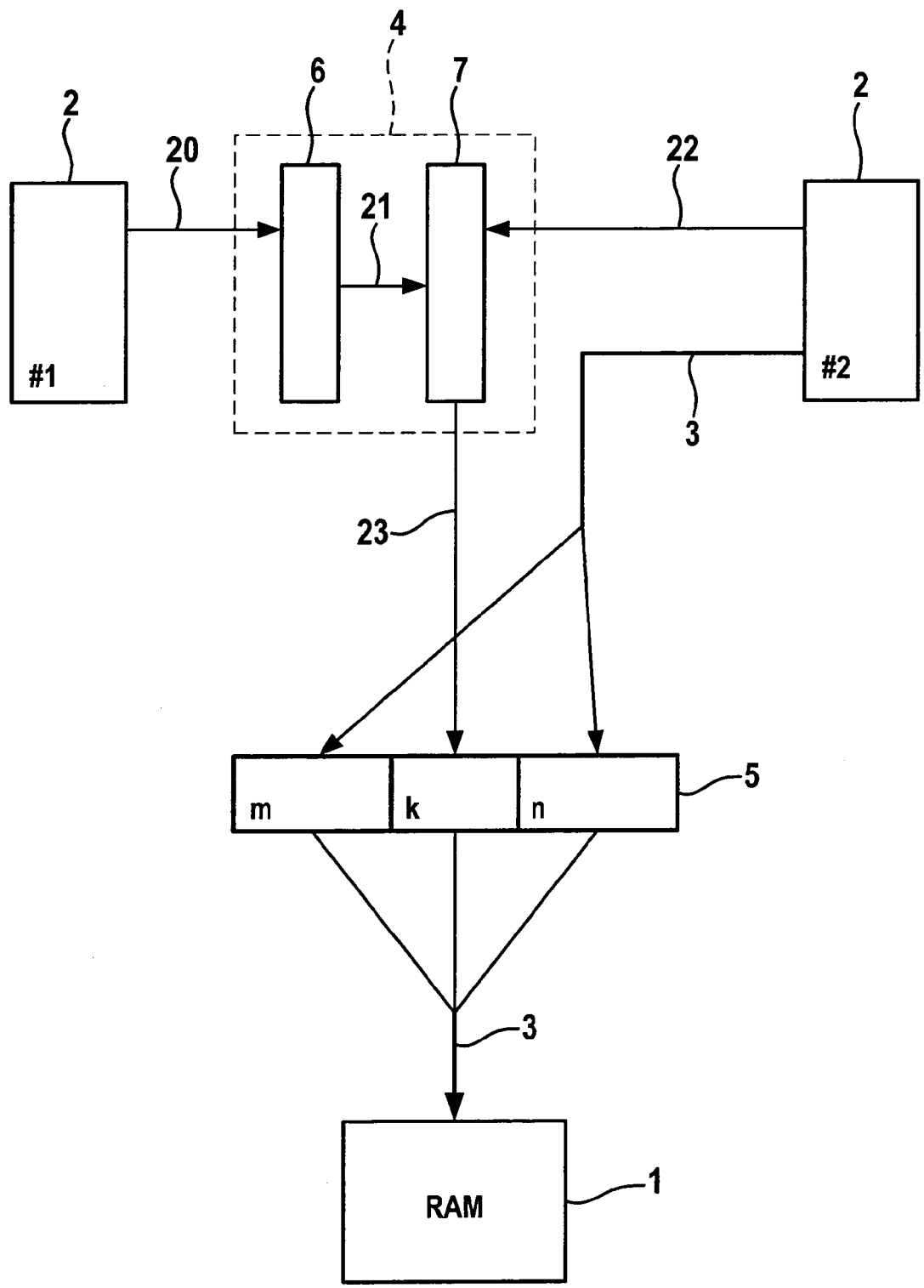
FIG. 3 shows a schematic block diagram to illustrate the method according to the present invention.

The method according to the present invention is explained in greater detail below with reference to FIGS. 2 and 3. In this method, one of processes #1, for example, a CPU, controls part of the address bus 3, using which another process #2, for example, a peripheral module, is accessing memory 1. The address bus is controlled by first process #1, which may be via writable control registers 4. The method according to the present invention has the advantage that both processes #1, #2 (or all processes 2, which are able to access memory 1) are able to access memory 1 without waiting times; no data packets are lost, and no complex memory management control system is required.

The data packets stored in memory 1 are all of the same size. The data packets may include $2^n$ memory words. If the data packets are not of the same size, they are split into two parts, namely a header part of a fixed size and a main part of a variable size. The size of the header part may be $2^n$ memory words. The header part contains a pointer to the main part, which may be located in the same memory 1 or in another memory. Each data packet is stored in at least two different versions A, B in memory 1. FIG. 2 shows an example of management of data in memory 1, including a total of 32 memory words, which are addressed using a 5-bit vector. Memory 1 includes four (=$2^2$) data packets (m=2), each in two (=$2^1$) versions (k=1), each having four (=$2^2$) data words (n=2).

In the method according to the present invention, the first process #1 is able to access all parts of memory 1. Furthermore, first process #1 is able to modify the address bus signal (on address bus 3) using which second process #2 accesses memory 1. This is true of access to data packets of the same size or, if the data packets are split into a header part and a main part, access to the header parts of the data packets. Access to the main part of the packets is not modified.

The second process, which accesses one of up to $2^m$ data packets (or one of up to $2^m$ header parts of data packets), each including two $2^n$ memory words, generates an address bus signal of the length (m+n) bits. Second process #2 is able to access a certain data word of a certain data packet or the corresponding region in memory 1 via this signal on address bus 3. However, second process #2 cannot differentiate between the addresses of a data packet stored in multiple versions, i.e., between the various versions of the data packet, by using this address bus signal. The additional address bits required for this come from control register 4, which is controlled by first process #1. It is possible to differentiate between $2^k$ stored versions of a certain data packet by using k additional bits. This yields on the whole an address bus signal 5 of (m+n+k) bit length. The three bit groups may have any positions in address signal 5. As already indicated, four data packets (m=2), each having four data words (n=2) are stored in two different versions (k=1) per data packet in memory 1, the management of which is shown in FIG. 2. The "data packet" column in FIG. 2 is labeled with reference numeral 10, the "version" column with reference numeral 11, the "memory word" column with reference number 12 and the "address" column with reference numeral 13. Memory 1 thus has room for a total of 32 memory words, which may be addressed via a 5-bit vector. The address is composed of the bits (m_k_n).

For each of the data packets contained in memory 1, there is one k-bit-wide two-stage control register 4 using which first process #1 is able to set which version of the desired data packet the other process #2 will be able to (or should) access. Register 4 may be designed in multiple stages, in particular in two stages. Thus there is a two-stage register 4 having a total of four k bits in the exemplary embodiment here. The two stages in register 4 are designated with reference numerals 6 and 7. First process #1 is able to select a certain version 11 of a data packet, which second process #2 is allowed to access, or it may merely deliver a control signal for switchover to the next available version 11. First process #1 is able to write to first stage 6 of register 4 (reference number 20) but not to second stage 7 of register 4. After first process #1 has written into first stage 6, the data for first stage 6 may be copied immediately to second stage 7 (reference numeral 21) if the other process #2 does not lock second stage 7 (reference numeral 22). The output of second stage 7 is then inserted into address bus signal 5 (reference numeral 23). If second stage 7 of register 4 is locked, the data from first stage 6 are copied into second stage 7 only after being unlocked. It is conceivable for first process #1 to also access the data packets in memory 1 via a modified address bus signal but then not the same version as second process #2.

In the handling of the method according to the present invention, a distinction is made between the data packets going from first process #1 to second process #2, and the data packets going in the opposite direction from second process #2 to first process #1.

The sequence of the method according to the present invention for data packets going from first process #1 to second process #2 will be described first. First process #1 first writes its data into a certain version 11 of a certain data packet 10, which is not accessible for second process #2, and immediately thereafter switches access by second process #2 to this version 11 of data packet 10.

Second process #2, which reads out a data packet 10, first locks (22) second stage 7 of control register 4 for this packet 10, then reads out version 11 of respective data packet 10 accessible to it in the block transfer (optionally as the header part and main part) and unlocks (22) second stage 7 for conclusion of the block transfer.

If the write access by first process #1 and the read access by second process #2 overlap in time, second process #2 reads out consistent data from older version 11 of data packet 10. This behavior is particularly important if second process #2 is a time-controlled communication controller (CC) 31 (for example, a TTCAN CC or a FlexRay CC). The point in time when a data packet 10 must be read out is defined here by communication system 33. In time-controlled communication systems 33 it is thus not possible to wait with the read access by communication controller 31 to data packet 10 until first process #1 has terminated its write access.

It is assumed here that first process #1 does not write the data into the memory regions provided for this more rapidly than the data is retrievable by second process #2. There is optionally the possibility that second process #2 will signal to first process #1 whether it has retrieved the data from a certain memory region at least once after the last switchover of packet versions 11.

If the data are to be transmitted from second process #2 to first process #1, then first process #1 first reads the data expected from second process #2 out of version 11 of data packet 10, which is not accessible for second process #2, and immediately thereafter switches access by second process #2 to this version 11 of packet 10.

Second process #2, which writes a data packet 10, first locks (22) second stage 7 of control register 4 for this packet 10, then writes packet 10 (optionally a header part and a main part) in the block transfer and unlocks (22) second stage 7 to conclude the block transfer.

If the read access by first process #1 and the write access by second process #2 overlap in time, first process #1 reads out consistent data from older version 11 of packet 10. This behavior is particularly important if the point in time when second process #2 is storing new data packets is not under the control of first process #1.

It is assumed here that first process #1 retrieves the data rapidly enough so that both versions 11 of a data packet 10 cannot contain unread data. It is optionally conceivable for second process #2 to signal to first process #1 whether it has updated the data of a certain data packet 10 since the last switchover of packet versions 11 and whether the data have been replaced multiple times since the last switchover, which could mean a loss of data.

The memory management method according to the present invention may be used in particular for message memories in hardware communication modules 31 of communication nodes 32 of a communication system (e.g., FlexRay, CAN, TTCAN). An application in other peripheral modules is also possible and advantageous.

What is claimed is:

1. A method for controlling access to regions of a memory from a plurality of processes, the regions of memory storing at least two versions of data packets, the method comprising:
controlling, using a first process of the plurality of processes, part of an address bus that is used by using a second process of the plurality of processes to access the memory; the controlling thereby influencing a memory region being accessed by the second process;
wherein the first process:
modifies an address bus signal to add additional bits;
controls part of the address bus via control registers; and
is able to access all regions of the memory.

2. The method of claim 1, wherein the memory is configured as a dual-ported RAM accessed by processes simultaneously.

3. The method of claim 1, wherein the memory is configured as a single-ported RAM accessed by the plurality of processes in alternation in a time multiplex process.

4. The method of claim 1, wherein data packets of a same size, which is 2n memory words, are stored in the memory.

5. The method of claim 1, wherein data packets of any size are stored in the memory, wherein each data packet is split into two parts, including a header part, having 2n memory words, and a main part of a variable size, and wherein the header parts of different data packets are the same size.

6. The method of claim 1, wherein data packets are stored in the memory in as many versions as there are processes capable of accessing the memory.

7. The method of claim 1, wherein the address bus signal:
prior to the modification, refers to a certain data packet stored in the memory or to a header part of a certain data packet stored in the memory; and the address bus signal, after the modification, is used by the second process to access the memory and refers to a certain version of the data packet or of the header part of the data packet.

8. The method of claim 7, wherein the unmodified address bus signal includes a certain number of address bits, and the first process adds at least one additional address bit to the unmodified address bus signal for modification of the address bus signal, so as to differentiate between the various stored versions of the data packet and the header part of the data packet.

9. The method of claim 8, wherein the second process accesses one of up to $2^m$ data packets stored in the memory or one of up to $2^m$ header parts of data packets stored in the memory, the data packets being of a size of $2^n$ memory words, wherein the unmodified address bus signal includes m +n bits and the modified address bus signal includes m +n +k bits, wherein $2^k$ equals a number of saved versions of each of the data packets, and wherein m, n, and k are non-zero values.

10. The method of claim 7, wherein a control register is provided for each data packet stored in the memory and for each header part of a data packet stored in the memory.

11. The method of claim 10, wherein the control registers are configured in two stages, and wherein the first process is able to write to the first stage of the control register at any time.

12. The method of claim 11, wherein the second process locks the second stage of the control register as needed, so that copying of the contents of the first stage of the control register to the second stage is suppressed.

13. The method of claim 11, wherein the contents of the first stage of the control register are copied to the second stage of the control register when the second stage is unlocked.

14. The method of claim 11, wherein the modification of the address bus signal includes insertion of contents of the second stage of the control register into the address bus signal.

15. A communication module of a node of a communication system, the module being connected to a communication medium, comprising:
a message memory for temporarily storing messages received via the medium or messages to be sent via the communication medium, regions of the message memory storing at least two versions of data packets; and
a controlling arrangement to control access to the regions of the message memory via the communication medium and from a node processor by controlling, using a first process, part of an address bus that is used by a second process to access the message memory;
wherein:
a memory region being accessed by the second process is influenced by the controlling the part of the address bus; and
the first process;
modifies an address bus signal to add additional bits;
controls part of the address bus via control registers; and
is able to access all regions of the message memory.

16. The communication module of claim 15, wherein the message memory is configured as a dual-ported RAM accessed by processes simultaneously.

17. The communication module of claim 15, wherein the message memory is configured as a single-ported RAM accessed by the plurality of processes in alternation in a time multiplex process.

18. The communication module of claim 15, wherein data packets of a same size, which is 2n memory words, are stored in the message memory.

19. The communication module of claim 15, wherein data packets of any size are stored in the message memory, wherein each data packet is split into two parts, including a header part, having 2n memory words, and a main part of a variable size, and wherein the header parts of different data packets are the same size.

20. The communication module of claim 15, wherein data packets are stored in the message memory in as many versions as there are processes capable of accessing the message memory.

21. The communication module of claim 15, wherein: the address bus signal: ,
prior to the modification, refers to a certain data packet stored in the memory or to a header part of a certain data packet stored in the memory; and
after the modification, is used by the second process to access the memory and refers to a certain version of the data packet or of the header part of the data packet.

22. The communication module of claim 21, wherein the unmodified address bus signal includes a certain number of address bits, and the first process adds at least one additional address bit to the unmodified address bus signal for modification of the address bus signal, so as to differentiate between the various stored versions of the data packet and the header part of the data packet.

23. The communication module of claim 22, wherein the second process accesses one of up to $2^m$ data packets stored in the memory or one of up to $2^m$ header parts of data packets stored in the memory, the data packets being of a size of $2^n$ memory words, wherein the unmodified address bus signal includes m+n bits and the modified address bus signal includes m+n+k bits, wherein $2^{1c}$ equals a number of saved versions of each of the data packets, and wherein m, n, and k are non-zero values.

24. The communication module of claim 21, wherein a control register is provided for each data packet stored in the message memory and for each header part of a data packet stored in the message memory.

25. The communication module of claim 24, wherein the control registers are configured in two stages, and wherein the first process is able to write to the first stage of the control register at any time.

26. The communication module of claim 25, wherein the second process locks the second stage of the control register as needed, so that copying of the contents of the first stage of the control register to the second stage is suppressed.

27. The communication module of claim 25, wherein the contents of the first stage of the control register are copied to the second stage of the control register when the second stage is unlocked.

28. The communication module of claim 25, wherein the modification of the address bus signal includes insertion of contents of the second stage of the control register into the address bus signal.

\* \* \* \* \*

UNITED STATES PATENT AND TRADEMARK OFFICE
CERTIFICATE OF CORRECTION

PATENT NO.        : 8,447,952 B2                                                                  Page 1 of 1
APPLICATION NO.   : 12/736825
DATED             : May 21, 2013
INVENTOR(S)       : Florian Hartwich It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 18 days.

Signed and Sealed this
Eighth Day of September, 2015

Michelle K. Lee
*Director of the United States Patent and Trademark Office*